United States Patent [19]
Marks et al.

[11] Patent Number: 4,657,325
[45] Date of Patent: Apr. 14, 1987

[54] ELECTRICAL CONNECTOR

[75] Inventors: Richard L. Marks, Mechanicsburg; William S. Scheingold, Palmyra; Ronald M. Smith, Harrisburg, all of Pa.

[73] Assignee: AMP Incorporated, Harrisburg, Pa.

[21] Appl. No.: 835,834

[22] Filed: Feb. 27, 1986

[51] Int. Cl.[4] .............................................. H01R 23/72
[52] U.S. Cl. ................................. 339/17 CF; 361/388
[58] Field of Search .......... 339/17 CF, 17 M, 17 LM, 339/174, 176 MP, 75 MP

[56] References Cited

U.S. PATENT DOCUMENTS

| | | | |
|---|---|---|---|
| 2,015,421 | 9/1935 | Eckstein et al. | 339/221 R |
| 3,874,768 | 4/1975 | Cutchaw | 339/17 CF |
| 3,912,983 | 10/1975 | Lowry, Jr. | 339/17 CF |
| 4,050,755 | 9/1977 | Hasircoglu | 339/17 CF |
| 4,255,003 | 3/1981 | Berg | 339/17 CF |

OTHER PUBLICATIONS

Western Electric Publication, Technical Digest No. 36, Fowler, p. 9, 10-1974.

Primary Examiner—Neil Abrams
Attorney, Agent, or Firm—Allan B. Osborne

[57] ABSTRACT

An electrical connector for electrically interconnecting conductive pads on a printed circuit board and an electronic package located in an opening in the board and for biasing the electronic package against a cooling substructure on which it rests. More particularly, the connector includes a housing having downwardly extending walls for abutting and biasing the electronic package against the substructure and a plurality of contact elements having spring members which electrically engage respective conductive pads on the electronic package and surrounding circuit board.

18 Claims, 9 Drawing Figures

ELECTRICAL CONNECTOR

FIELD OF THE INVENTION

The present invention relates to electrical connectors for interconnecting conductive pads on an electronic package to conductive traces on a printed circuit board with both the electronic package and circuit board positioned on a heat dissipating substructure and the electronic package located in an opening in the circuit board.

BACKGROUND OF THE INVENTION

It is well known that electronic packages containing integrated circuits generate heat while in the operating mode. The amount of heat generated may be small or quite large depending on the function of the circuitry and the type of logic used in the circuitry. The number of transistors and current consumption are also important factors in heat generation.

Heat management includes cooling frames (U.S. Pat. No. 3,955,867) and heat exchangers (U.S. Pat. No. 4,345,267). In both of these cases, the heat transfer device is an addition to the electrical socket or connector in which the electronic package is positioned. Another heat dissipating assembly is disclosed in U.S. Pat. No. 4,546,405. Heat conductive pins, brazed or soldered to the ceramic cover of the electronic package, extend to and support an overlying cooling fin structure. Heat travels through the pins to the fin structure for dissipation.

Still another system for dissipating heat is to mount the circuit board on a conductive substructure and divert heat thereto by means of conductive pins which are attached to the substrate of the electronic package and extend through the board to the substructure. The use of a substructure has several advantages, one being that the upper surface of the circuit board is free of cooling devices. Another advantage is that the substructure has substantial mass and surface exposure to readily absorb and dissipate heat. A drawback to the use of conductive pins is that they must be soldered or otherwise firmly secured to the substrate and substructure to insure good heat transfer. Removal of the package requires desoldering or other labor and time consuming efforts. It has now been proposed to provide an opening in the circuit board and place the substrate directly onto the substructure. This proposal, however, requires a device for connecting the conductive pads on the electronic package to the circuit board and further a device for pressing the package against the substructure to maximize heat transfer thereto.

It is therefore the intent of the present invention to provide an electrical connector which electrically connects conductive pads on the electronic package to respective conductive pads on the circuit board and which also provides means for biasing the package against the substructure.

SUMMARY OF THE INVENTION

According to the present invention, an electrical connector for interconnecting conductive pads on an electronic package positioned on a cooling substructure through an opening in a circuit board also positioned on the cooling substructure and conductive pads on the circuit board includes a dielectric housing positioned on the circuit board and over the electronic package. Contact elements retained in the housing include diverging spring members which engage aligned conductive pads on the electronic package and circuit board to provide electrical paths therebetween. In securing the electrical connector to the unit comprised of the underlying cooling substructure, circuit board and electronic package, compressive forces are applied to the contact elements which cause the spring members to spread apart. As the spring members slide along the conductive pads, debris and oxidation are removed therefrom to provide clean contact areas. Partial release of the compressive forces results in rewiping and places the spring members on a previously cleaned surface for enhanced electrical interfaces. Additionally, as the electrical connector is secured to the unit, it biases the electronic package against the cooling substructure to improve heat transfer therebetween. Also according to the present invention, a printed circuit board includes an opening for receiving the electronic package and alignment means for positioning the package in the opening whereby conductive pads on the package are in alignment with respective conductive pads on the circuit board.

BRIEF DESCRIPTION OF THE DRAWINGS

FIG. 5-A is an enlarged, perspective view of the contact element;

FIG. 5-B is an enlarged plan view of the contact element after being stamped and prior to being formed;

DESCRIPTION OF THE INVENTION

Figure 1:
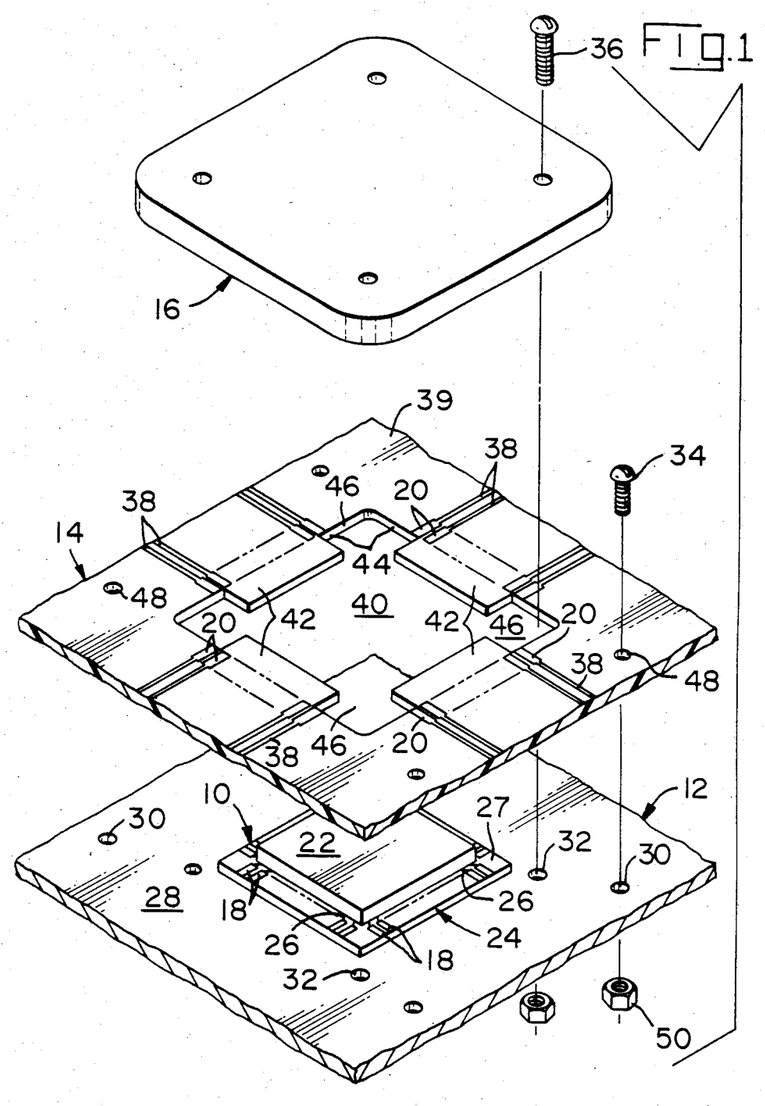
FIG. 1 is an exploded, perspective view of an electronic package on a cooling substructure with a printed circuit board and an electrical connector of the present invention located thereabove.

FIG. 1 shows electronic package 10 positioned on substructure 12, printed circuit board 14 exploded from substructure 12 to which it is to be secured and, above circuit board 14, electrical connector 16 which electrically connects conductive pads 18 on package 10 to conductive pads 20 on circuit board 14.

Electronic package 10 includes an integrated circuit chip or chips; i.e., a hybrid package (not shown) located within cover 22 and ceramic substrate 24 on which the chip and cover 22 are mounted. Conductive traces 26 connect the chip to the aforementioned conductive pads 18 on upper surface 27 of substrate 24.

Substructure 12 is a plate 28 of copper or other material having a high degree of heat conductivity. Holes 30, 32 are provided in plate 28 to receive threaded bolts 34, 36 respectively in mounting circuit board 14 and electrical connector 16 thereto.

Figure 2:
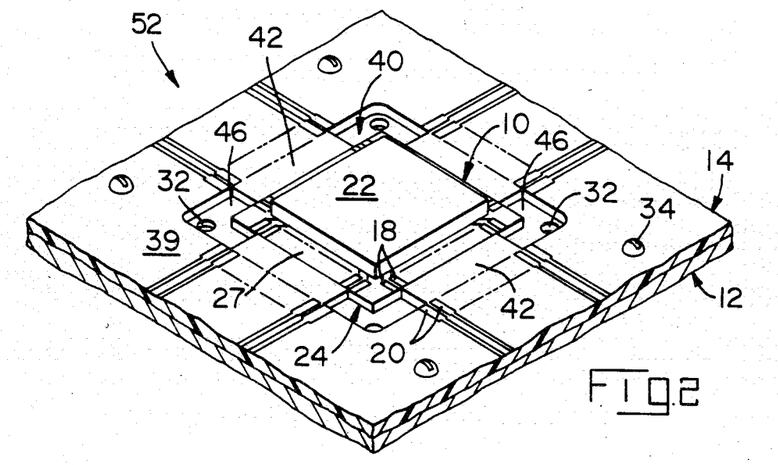
FIG. 2 is a perspective view of the circuit board, electronic package and substructure assembled to form a unit on which the electrical connector of FIG. 1 is to be mounted.
Figures 7, 8:
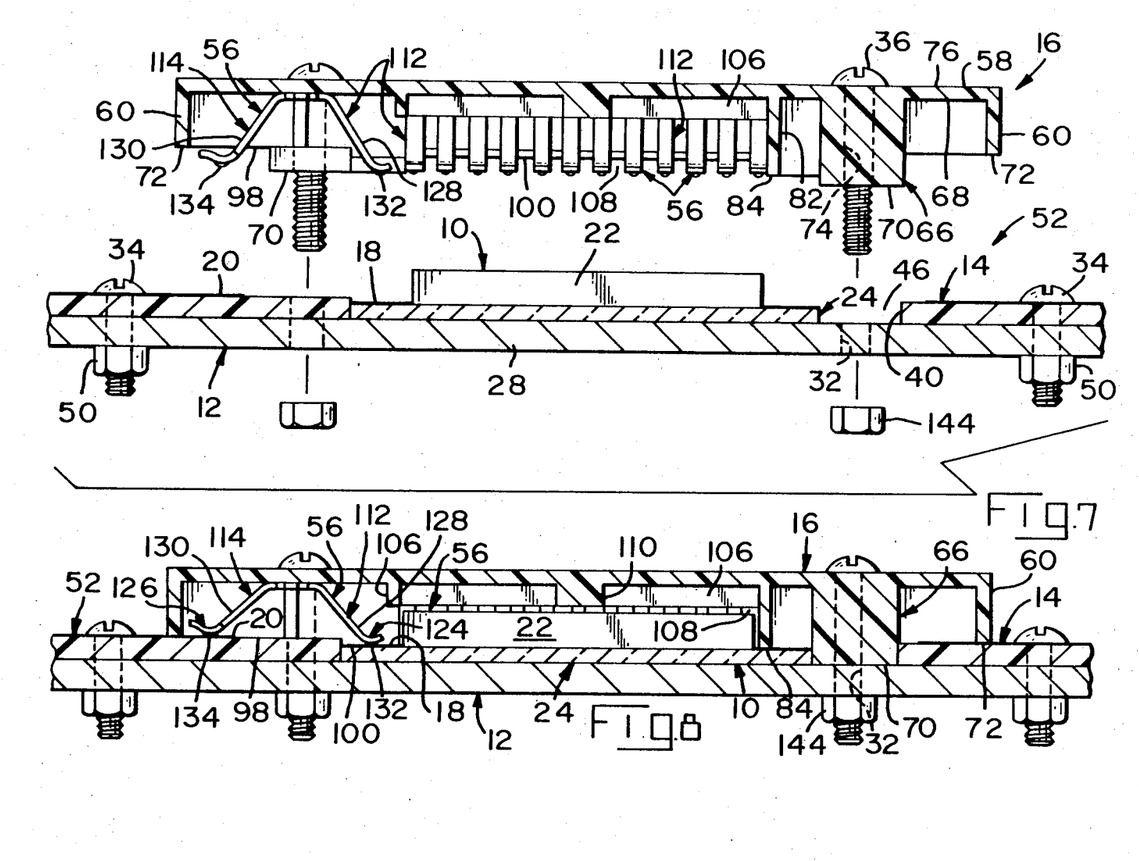
FIG. 7 is a cross-sectional side view taken along line 7—7 in FIG. 3, showing the unit of FIG. 2 with an electrical connector thereabove for mounting thereon.
FIG. 8 is a cross-sectional side view of the electrical connector mounted on the unit.

Circuit board 14 can be a conventional single or multi-layer board having conductive traces 38 connecting the aforementioned conductive pads 20, both shown on upper surface 39, to electronic components (not shown) elsewhere on board 14 or to electrical connectors such as the low height chip carrier socket (not shown) disclosed in U.S. Pat. No. 4,427,249. Opening 40 is provided in board 14 to accommodate electronic package 10 as shown in FIG. 2 and electrical connector 14 as shown in FIG. 7. Piers 42 project into opening 40 from each side wall 44 thereof, defining in cooperation with adjacent piers 42 semi-isolated corner spaces 46 of opening 40.

Holes 48 are provided in board 14 to receive bolts 34 in securing board 14 to substructure 12 in cooperation with the aforementioned holes 30 and nuts 50.

FIG. 2 shows unit 42 which includes electronic package 10, substructure 12 and circuit board 14. As noted above, circuit board 14 is secured to substructure 12 by means of bolts 34 and nuts 50. Electronic package 10 is unsecuredly located within opening 40 with ceramic substrate 24 resting on substructure 12. Note that upper surface 27 of substrate 24 is below upper surface 39 of board 14; i.e., board 14 is thicker than substrate 24 as best shown in FIG. 8. The inwardly projecting piers 42 on board 14 precisely position package 10 so that conductive pads 18 thereon are in alignment with respective conductive pads 20 on board 14. Holes 32 in substructure 12 are accessible through corner spaces 46 of opening 40. Various keying devices (not shown) are well known by which package 10 may be positioned within opening 40 with a desired orientation relative to board 14.

Figure 3:
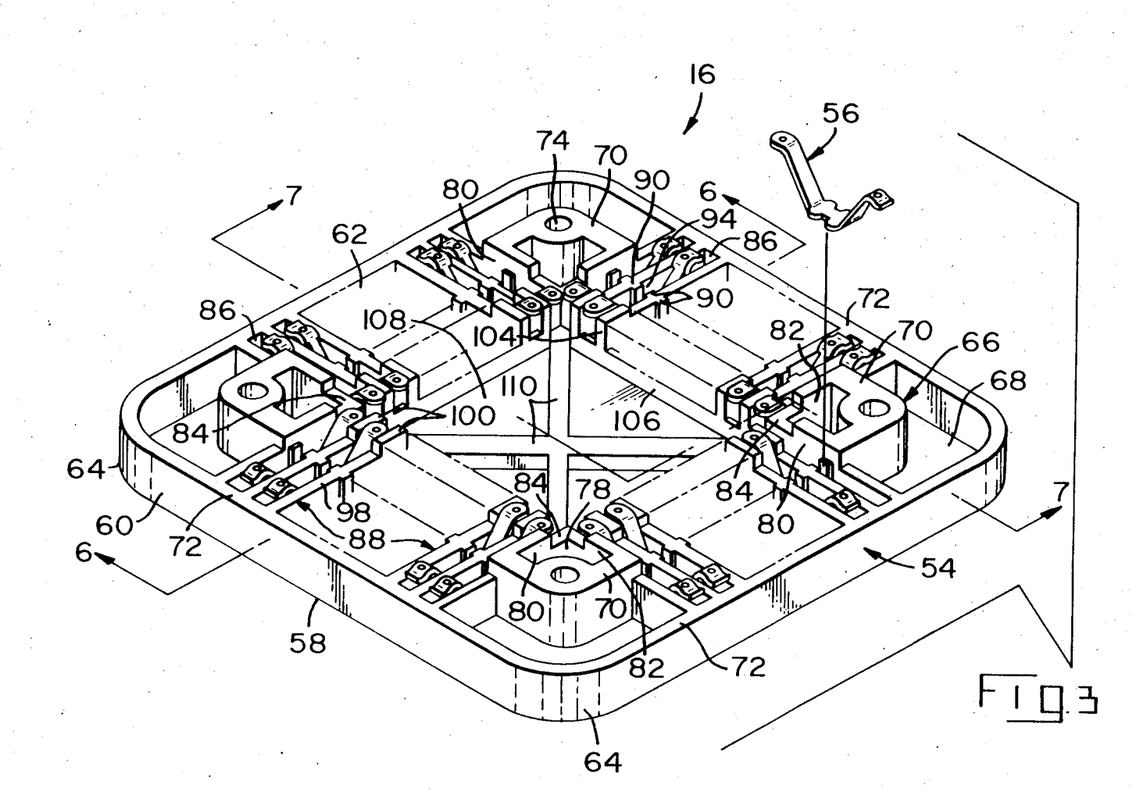
FIG. 3 is a perspective view of the underside of the electrical connector showing the internal structure and a contact element exploded therefrom.

With reference to FIG. 3, electrical connector 16, shown in an inverted position, includes insulative housing 54 and a plurality of contact elements 56.

Housing 54 is preferably molded with a suitable dielectric material being polysulfone, a synthetic thermoplastic polymer.

Figure 6:
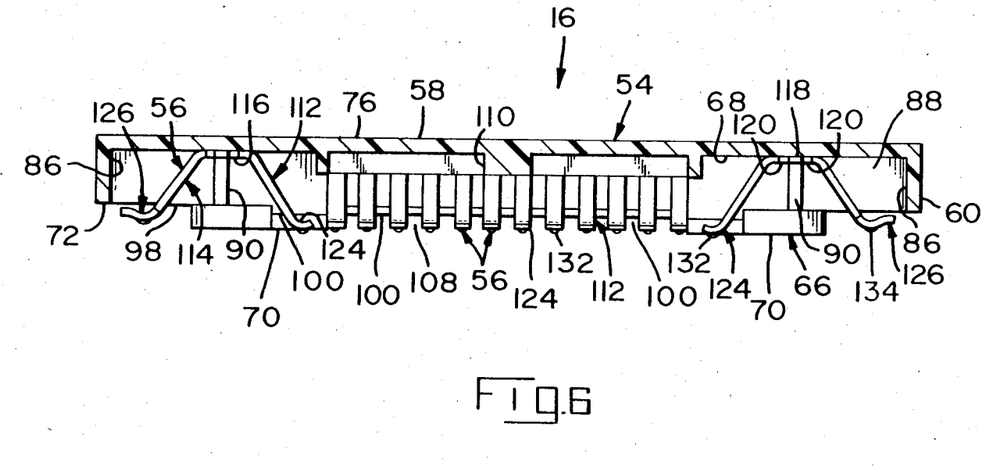
FIG. 6 is a side, cross-sectional view of the electrical connector right side up with the section being taken along line 6—6 in FIG. 3.

Reference will now be made to both FIGS. 3 and 4, the latter being an enlarged corner portion of housing 54. Top wall 58 and depending side walls 60 define downwardly open cavity 62. Spaced inwardly from each corner 64 are support blocks 66 attached to inside surface 68 of top wall 58 and extending downwardly with surface 70 being spaced out further than downwardly facing edges 72 of side walls 60 as shown in FIG. 6. Holes 74 pass through top wall 58 and blocks 66, opening out on outer surface 76 (FIG. 6) of wall 58 and surfaces 70. Voids 78, provided in each block 66 to save material and weight, define a pair of intersecting walls 80, 82 which are recessed or notched to provide a downwardly facing edge 84 which is on a level intermediate surface 70 and edges 72.

A number of downwardly open, contact element retaining slots 86 are defined by transverse walls 88 extending in from side walls 60 and down from inside surface 68 of top wall 58. Perpendicularly extending ribs 90 are provided on inner surfaces of walls 88 and blocks 66 to define narrow passages or gaps 94 in each slot 86.

The outer surface of each wall 88 is stepped to provide a first edge 98 which is on the same level or plane as downwardly facing edges 72 of side walls 60 and a second edge 100 which is on the same level or plane as downwardly facing edges 84 on blocks 66. As will be seen later, the stepped configuration of the outer surfaces of walls 88 accommodate the different thicknesses of circuit board 14 and substrate 24 of electronic package 10.

Inwardly facing ends 104 of transverse walls 88 merge into a low height barrier wall 106 extending down from inside surface 68 and across slots 86. Free ends 104 and barrier walls 106 define center space 108 into which cover 22 on electronic package 10 extends as shown in FIG. 8. Criss-crossing ribs 110 on inner surface 68 of top wall 58 tie into barrier walls 106 to provide strength to top wall 58.

Figure 5A:
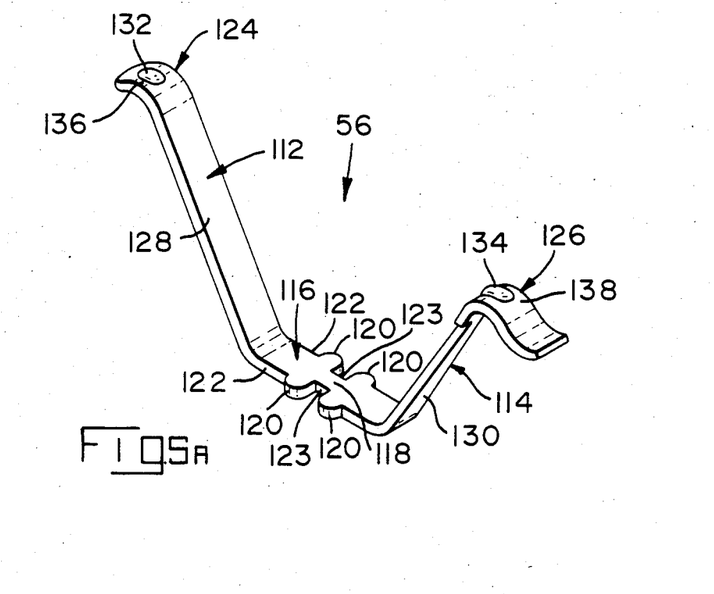
Figure 5B:
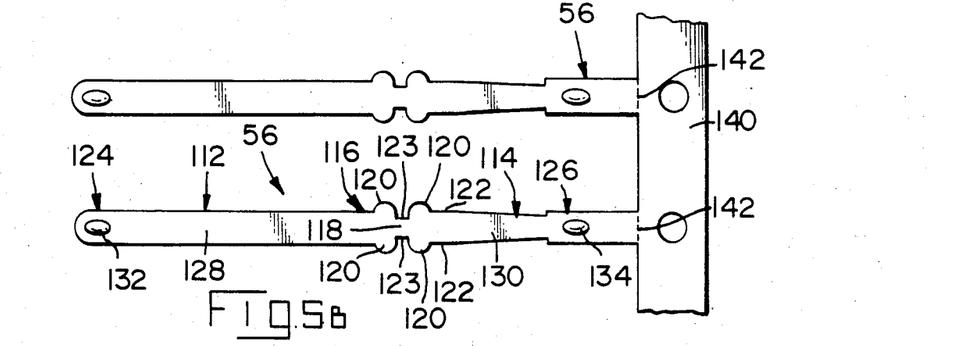

Contact element 56 shown inverted in FIG. 3 is shown in an enlarged scale in FIGS. 5-A and 5-B, the latter view taken prior to element 56 being formed. With reference now to FIGS. 5-A and 5-B, contact elements 56 are preferably stamped and formed on continuous strip from flat stock (not shown). A preferred material is beryllium copper.

As shown in FIG. 5-A, element 56 is generally U-shaped with the two diverging legs providing first and second spring members 112, 114 respectively. Spring members 112, 114 extend obliquely away from their attachment to respective ends of flat, connecting strap 116.

Strap 116 includes an intermediately positioned aligning portion 118 bracketed by four curved, retaining and stabilizing ears 120 projecting laterally from respective sides 122. Aligning portion 118 has a reduced width provided by notches 123 cut into sides 122, the width of portion 118 being only very slightly less than the width of gap 94 in slots 86 of housing 54. Each pair of ears 120 on each side 122 are spaced apart a distance only slightly greater than the width of ribs 90 defining gap 94.

First and second spring members 112, 144 include concavo-convex or arcuate shaped free ends 124, 126 respectively and elongated beams 128, 130 respectively which are attached to and extend between respective ends of strap 116 and free ends 124, 126. Raised contact surfaces 132, 134 are provided on and longitudinally span most of convex surfaces 136, 138 respectively of free ends 124, 126 respectively.

As shown in FIG. 5-B, contact elements 56 are attached to carrier strip 140 with the point of attachment being at free end 126. Accordingly, free ends 126, after detachment from strip 140, are squared as opposed to the rounded free ends 124 and are slightly longer than free ends 124 so that the score lines, indicated by reference numeral 142 in FIG. 5-B, are not on convex surface 134.

The width of beam 128 is constant and is the same as strap 116 at the point of attachment therebetween. Beam 130 on the other hand is shorter than beam 128 and narrows uniformly from its attachment to strap 116 outwardly to free end 126 which, as can be seen, is not reduced in width. The narrowing makes short beam 130 as resilient as longer beam 128.

As seen in FIG. 8, beam 130 is shorter to accommodate the thicker circuit board 14. In the case of the reverse or where both board 14 and substrate 24 are of the same thickness, beams 128, 130 would be modified accordingly.

Figure 4:
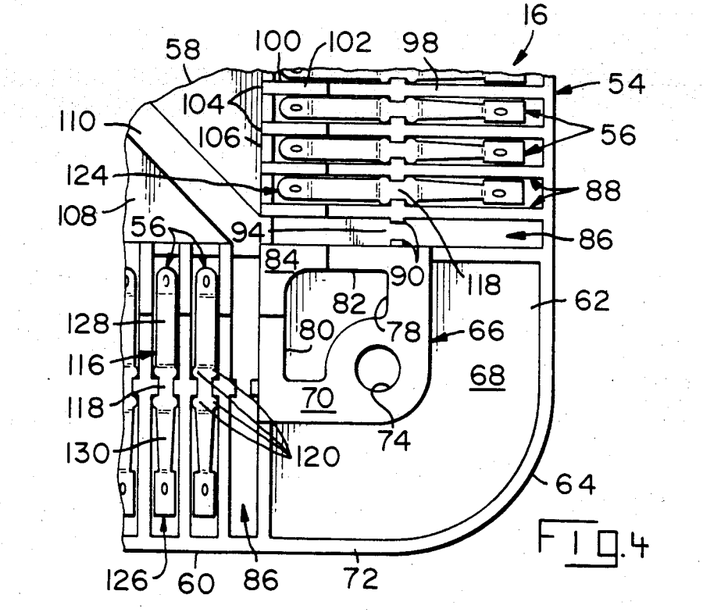
FIG. 4 is an enlarged, perspective view of the underside of the electrical connector showing a corner quadrant thereof.

As shown in FIGS. 3, 4, and 6, the latter figure being a side cross-sectional view of connector 10 right side up, contact elements 56 are positioned in slots 86 with straps 116 against inside surface 68 of top wall 58 and with spring members 112, 114 projecting obliquely downwardly. Elements 56 are aligned in slots 86 as well as held against longitudinal sliding movement by aligning portions 118 of straps 116 being frictionally received in gaps 94. Ears 120 bracket ribs 90 on the inner surfaces of walls 88, blocks 66 to frictionally retain elements 56 in slots 86 and to restrain elements 56 from yaw, pitch and rolling motions. Thus, ears 120 stabilize as well as retain contact elements 56 in slots 86.

Elements 56 are oriented in slots 86 with free end 124 adjacent center space 108 of housing 54 and free ends 126 adjacent side walls 60. As shown in FIGS. 3 and 6, free ends 124 extend outwardly beyond edges 100 on walls 88 and, as shown in FIG. 7, beyond edges 84 on blocks 66. Free ends 126 extend outwardly beyond edges 72 on housing side walls 60. Being shorter, second spring members 114 do not extend as far outwardly from slots 86 as first spring members 112.

FIGS. 7 and 8 illustrate electrical connector 16 being mounted onto unit 52. As shown in FIG. 7, connector 16 is above unit 52 with bolts 36 in holes 74 and is orientated so that blocks 66 are in alignment with corner spaces 46 of opening 40.

As shown in FIG. 8, connector 16 has been placed onto unit 52. Bolts 36 have been received in holes 32 in substructure 12 and nuts 144 threaded thereonto from beneath substructure 12. Prior to being secured, only spring members 112, 114 engage unit 52. After tightening nuts 144 down to a given torque, connector 16 bottoms out against unit 52 with surfaces 70 on blocks 66 abutting substructure 12. The length of blocks 66 is predetermined to abut substructure 12 before spring members 112, 114 can be over-stressed. Further, edges 72 on side walls 60 and edges 98 on walls 88 engage circuit board 14 and edges 84, 100 on blocks 66 and walls 88 respectively rest on substrate 24. Cover 22 is received in space 108 and ribs 110 can engage cover 22 to prevent overstressing spring members 112, 114.

Contact surfaces 132 on spring members 112 engage respective conductive pads 18 on substrate 24 and contact surfaces 134 on spring members 114 engage respective conductive pads 20 on circuit board 14. Correct registration of spring members 112, 114 with respective conductive pads 18, 20 is automatically obtained by reason of blocks 66 entering corner spaces 46.

As nuts 144 are tightened, a compressive force is placed on contact elements 56, causing spring members 112, 114 to spread apart. As members 112, 114 spread, contact surfaces 132, 134 slide along conductive pads 18, 20 respectively, wiping debris and oxidation therefrom to provide clean contact areas. Rewipe and accordingly a better electrical interface can be obtained by loosening nuts 144 a bit, letting spring members 112, 114 recover slightly so that contact surfaces 132, 134 slide back onto a previously wiped area on pads 18, 20 respectively.

In addition to compressing spring members 112, 114, a force is exerted against electronic package 16 through edges 84, 100 bearing against substrate 24 as noted above. This pushes substrate 24 against substructure 12 to improve heat transfer therebetween.

Bolts 34, 36 can be self-tapping screws if desired or other conventional securing means.

As can be discerned, an electrical connector has been disclosed which provides contact elements for interconnecting conductive pads on an electronic package and a circuit board where the electronic package is positioned in an opening in the circuit board and the respective conductive pads may be vertically offset with respect to each other as illustrated. Further, the circuit board and electronic package are positioned on a cooling substructure with the ceramic substrate of the package bearing directly against the substructure. The electrical connector includes a dielectric housing which fits over the electronic package and surrounding portions of the circuit board. Contact elements within the housing have diverging spring members which engage the aligned conductive pads on the circuit board and electronic package. In mounting the electrical connector, compressive forces are placed on the contact elements to generate a wiping action as well as the required normal forces for electrical contact between contact surfaces on the spring members and the respective conductive pads. Further, a printed circuit board having an opening for receiving the electronic package and alignment means for positioning the package therein for aligning conductive pads on the package with respective conductive pads on the board has been disclosed.

We claim:

1. An electrical connector for electrically interconnecting conductive means on the surfaces of a printed circuit board and an electronic package located in an opening in said circuit board and further with both of said circuit board and electronic package being positioned on a cooling substructure, said electrical connector comprising:
   dielectric housing means placeable over said electronic package and portions of said circuit board imemdiately surrounding said electronic package;
   block means extending outwardly from said housing means for abutting and securing engagement with said substructure through said opening in said circuit board; and
   a plurality of conductive contact means having a pair of diverging spring means, said contact means being disposed in said housing means with said spring means extending outwardly therefrom for electrical engagement with respective conductive means on said circuit board and said electronic package.

2. The electrical connector of claim 1 further including wall means in said housing means for engaging said electronic package.

3. The electrical connector of claim 2 wherein said wall means define slot means for receiving said contact means.

4. The electrical connector of claim 3 wherein said contact means include strap means attached to and extending between said diverging spring means.

5. The electrical connector of claim 4 wherein said spring means include first and second spring members.

6. The electrical connector of claim 5 wherein said spring members include concavo-convex shaped free ends with raised, elongated contact surfaces on the convex surface of said free ends for engaging said conductive means.

7. The electrical connector of claim 6 wherein said spring members include beams attached to and extending between respective ends of said strap means and said free ends.

8. The electrical connector of claim 7 further including cooperating retaining means in said slots and on said strap means to retain said contact means in said slots.

9. The electrical connector of claim 8 wherein said retaining means in said slots include said wall means and said retaining means on said strap means include laterally projecting ears which frictionally engage said wall means.

10. The electrical connector of claim 9 further including ribs on opposing wall means and notches cut into opposing sides of said strap means which receive said ribs to align said contact means in said slots.

11. The electrical connector of claim 10 wherein said ears bracket said notches, said ears cooperating with said ribs in said slots to prevent pitch, yaw and rolling motion of said contact means disposed in said slots.

12. The electrical connector of claim 1 wherein said securing means includes bolts extending through said block means and said substructure and nuts threadably received on said bolts on an underside of said substructure.

13. The electrical connector of claim 12 wherein said diverging spring means include first and second spring members with each spring member having a concavo-convex shaped free end at the end of an elongated beam.

14. The electrical connector of claim 13 further including elongated, raised contact surfaces on the convex surfaces of said free ends for engaging said conductive means on said circuit board and said electronic package.

15. The electrical connector of claim 14 wherein said contact means are compressed as said nuts are tightened onto said bolts, causing said spring members to spread apart with said contact surfaces wiping said conductive means.

16. The electrical connector of claim 15 wherein said spring members recover upon loosening said nuts whereupon said contact surfaces wipe back over said wiped conductive means.

17. A printed circuit board for use with an electronic package and an electrical connector placeable over said electronic package and having contact means for electrically connecting conductive means on said package to conductive means on said circuit board and further having block means extending outwardly therefrom, said circuit board characterized in having an opening therein for receiving said electronic package and further having alignment means extending into said opening to define specific spaces in said opening in which said block means on said electrical connector are received to thereby align said contact means therein with respective conductive means on said package and said circuit board.

18. The printed circuit board of claim 17 characterized in that said alignment means include piers extending into said opening with said specific spaces being defined by adjacent piers.

* * * * *